United States Patent [19]
Taft et al.

[11] Patent Number: 5,624,854
[45] Date of Patent: Apr. 29, 1997

[54] METHOD OF FORMATION OF BIPOLAR TRANSISTOR HAVING REDUCED PARASITIC CAPACITANCE

[75] Inventors: Robert C. Taft; James D. Hayden, both of Austin, Tex.

[73] Assignee: Motorola Inc., Schaumburg, Ill.

[21] Appl. No.: 446,397

[22] Filed: May 22, 1995

Related U.S. Application Data

[62] Division of Ser. No. 939,342, Sep. 2, 1992, Pat. No. 5,504,363.

[51] Int. Cl.$^6$ ............................................. H01L 21/265
[52] U.S. Cl. ......................................................... 438/331
[58] Field of Search ............................ 437/31, 47, 918; 148/DIG. 9, DIG. 10, DIG. 136

[56] References Cited

U.S. PATENT DOCUMENTS

| | | | |
|---|---|---|---|
| 3,631,309 | 12/1971 | Myers | 317/235 R |
| 3,654,530 | 4/1972 | Lloyd | 317/235 |
| 3,802,968 | 4/1974 | Ghosh et al. | 148/175 |
| 3,810,123 | 5/1974 | Baitinger et al. | 340/173 |
| 3,892,596 | 7/1975 | Bjorklund et al. | 148/1.5 |
| 3,933,528 | 1/1976 | Sloan, Jr. | 437/47 |
| 3,945,032 | 3/1976 | Grundy et al. | 148/DIG. 136 |
| 4,247,343 | 1/1981 | Kruzhanov et al. | 148/1.5 |
| 4,272,776 | 6/1981 | Weijland et al. | 357/50 |
| 4,416,055 | 11/1983 | McCarthy et al. | 29/577 |
| 4,418,469 | 12/1983 | Fujita | 29/577 |
| 4,868,135 | 9/1989 | Ogura et al. | 437/31 |
| 5,045,483 | 9/1991 | Delong et al. | 437/31 |
| 5,158,900 | 10/1992 | Lau et al. | 437/31 |
| 5,206,182 | 4/1993 | Freeman | 437/33 |
| 5,208,171 | 5/1993 | Ohmi | 437/31 |
| 5,218,228 | 6/1993 | Williams et al. | 257/593 |
| 5,227,654 | 7/1993 | Momose et al. | 257/370 |
| 5,316,964 | 5/1994 | Gross | 148/DIG. 136 |
| 5,432,104 | 7/1995 | Sato | 148/DIG. 10 |

FOREIGN PATENT DOCUMENTS

| | | |
|---|---|---|
| 56-74959 | 6/1981 | Japan. |
| 3-87059 | 4/1991 | Japan. |

OTHER PUBLICATIONS

Ziegler et al, "Experimental Evaluation of . . . Transistor Pedestal Collector", IBM J. Res. Develop., Nov. 1971, pp. 452–456.

Naiman et al., "High–Value Resistance Conf. . . Circuits", IBM Tech. Dis. Bull., vol. 13, No. 1, Jul. 1970, pp. 479–480.

Garnache et al., "Compact . . . Cell", IBM Tech. Dis. Bull., vol. 15, No. 1, Jun. 1972.

S. Konaka et al., "A 20–ps Si Bipolar IC Using Advanced Super Self–aligned Process Technology with Collector Ion Implantation," IEEE Trans. Electron Devices, vol. 36, No. 7, Jul. 1989, pp. 1370–1375.

J. Bruchez et al., "the Philosophy of a Single Collector Diffusion Isolation process," Solid State Technology, Aug. 1987, pp. 93–97.

W.T. Tsang, Semiconductor And Semimetals vol. 22, Academic Press, New York, 1985, Chapter 1, pp. 143–172.

C. Kirkman, "A Gate Array Technology For 100MHz Digital ASIC Systems," New Electronics, Apr. 1987, pp. 28 and 30.

H. Nakashiba et al., "An Advanced PSA Technology for High–Speed Bipolar LSI," IEEE Trans. Electron Devices, vol. 27, No. 8, Aug. 1980, pp. 1390–1394.

S.M. Sze, Semiconductor Devices Physics and Tech., John Wiley & Sons, New York, 1985, pp. 110–111.

*Primary Examiner*—George Fourson
*Assistant Examiner*—Long Pham
*Attorney, Agent, or Firm*—Kent J. Cooper

[57] ABSTRACT

Vertically stacked regions of n-type and p-type conductivity are formed around bipolar and field effect transistors to reduce parasitic capacitance between the semiconductor device and surrounding well regions. Under reverse bias a portion of the vertically stacked region is fully depleted and thus reduces the parasitic capacitance between the semiconductor device and the well region.

27 Claims, 2 Drawing Sheets

METHOD OF FORMATION OF BIPOLAR TRANSISTOR HAVING REDUCED PARASITIC CAPACITANCE

This is a divisional of application Ser. No. 07/939,342, filed Sep. 2, 1992 now U.S. Pat. No. 5,504,363.

FIELD OF THE INVENTION

This invention relates generally to semiconductor devices, and more specifically to a semiconductor device having reduced capacitance and a process for the formation thereof.

BACKGROUND OF THE INVENTION

The semiconductor industry is continually striving to fabricate integrated circuits with ever increasing performance and higher packing densities. Traditionally, the semiconductor industry has simultaneously met both the performance and the packing density requirements by reducing the feature size of semiconductor devices. As the feature size of semiconductor devices continues to be reduced, however, gains in integrated circuit performance, that are normally associated with a reduction in device feature size, are less than expected. This occurs because as device dimensions are reduced other effects, such as parasitic capacitance, are no longer negligible and increases in integrated circuit performance, resulting from a reduction in device feature size, are limited by parasitic capacitance. Therefore, the parasitic capacitance associated with semiconductor devices must be minimized in order to achieve integrated circuits with improved performance. Accordingly, a need exists for semiconductor devices with reduced parasitic capacitance.

SUMMARY OF THE INVENTION

The previously mentioned problems with existing semiconductor devices are overcome by the present invention. In one embodiment of the invention, an integrated circuit is formed. The integrated circuit has a substrate that has a semiconductor device formed therein. The integrated circuit has a doped region formed within the substrate that is laterally offset from the semiconductor device. The integrated circuit has at least three vertically stacked regions of alternating conductivity type formed in the substrate that lie between the semiconductor device and the doped region.

These and other features, and advantages, will be more clearly understood from the following detailed description taken in conjunction with the accompanying drawings. It is important to point out that the illustrations may not necessarily be drawn to scale, and that there may be other embodiments of the present invention that are not specifically illustrated.

DETAILED DESCRIPTION OF A PREFERRED EMBODIMENT

Figure 1:
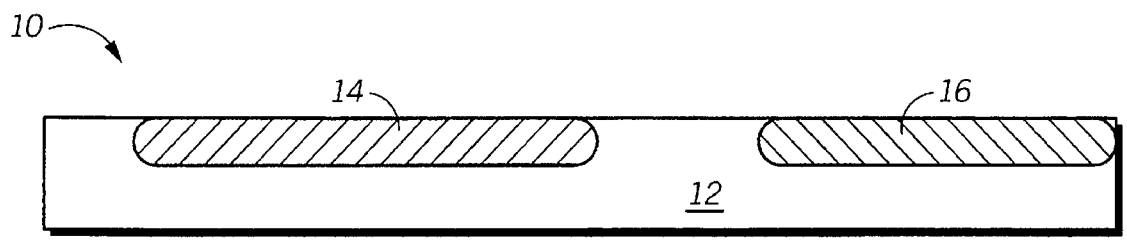
FIGS. 1–7 illustrate, in cross-section, process steps in accordance with one embodiment of the invention.

FIGS. 1 through 7 illustrate, in cross-section, process steps in accordance with one embodiment of the invention wherein a semiconductor device is formed. Shown in FIG. 1 is a portion 10 of an integrated circuit structure comprising a silicon substrate 12, a first buried layer 14, and a second buried layer 16. Silicon substrate 12 preferably has p-type conductivity and is lightly doped with boron. First buried layer 14 and second buried layer 16 are formed using conventional doping techniques such as ion implantation or diffusion. In the preferred embodiment first buried layer 14 has n-type conductivity and is doped with arsenic and second buried layer 16, which is laterally offset from first buried layer 14, has p-type conductivity and is doped with boron.

Figure 2:
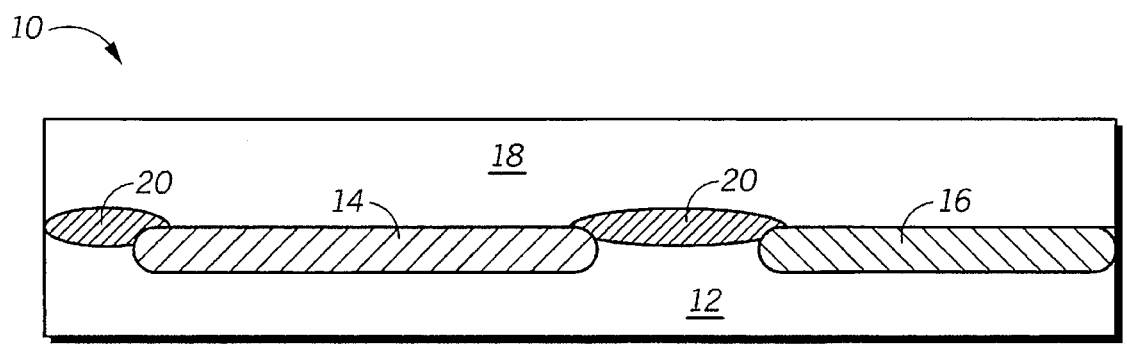

Using conventional processing techniques an epitaxial layer of silicon is then deposited over silicon substrate 12. During the epitaxial deposition process a doped region 20 having n-type conductivity is formed between first buried layer 14 and second buried layer 16, as shown in FIG. 2. This occurs because some of the dopants lying within first buried layer 14 become volatile during the epitaxial silicon deposition process and dope regions surrounding first buried layer 14. The mechanism by which this occurs is known as auto-doping. Doped region 20 is lightly doped and has a lower doping concentration than first buried layer 14. Alternatively, doped region 20 may also be formed using conventional ion implantation techniques prior to the deposition of the epitaxial layer of silicon. After deposition, the epitaxial layer of silicon is then doped using conventional doping techniques. This forms a doped region 18 that overlies silicon substrate 12. Doped region 18 has p-type conductivity and is preferably lightly doped with boron. Alternatively, doped region 18 may also be formed using an insitu-doped epitaxial silicon deposition process. Although not shown in FIG. 2, first buried layer 14 and second buried layer 16 may also extend into the deposited epitaxial layer due to dopant diffusion.

Figure 3:
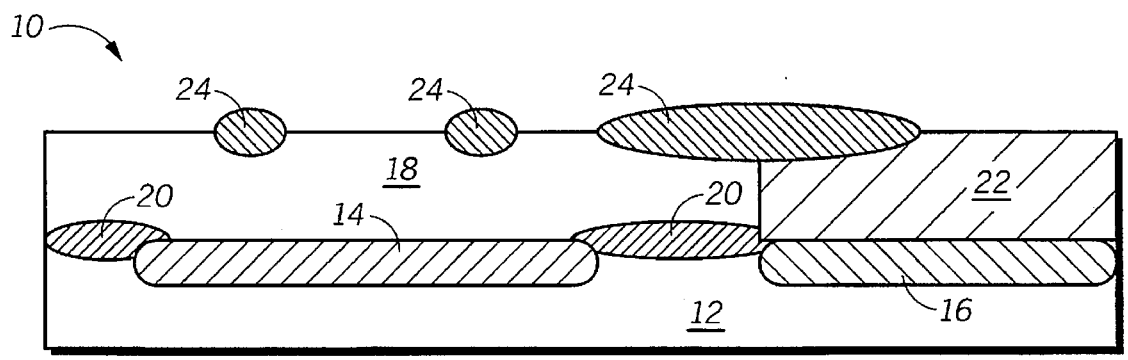

Using conventional doping techniques a well region 22 is then formed within a portion of doped region 18. Well region 22 is also laterally offset from first buried layer 14, as shown in FIG. 3. Well region 22 has p-type conductivity and is preferably doped with boron. A conventional isolation process such as LOCOS is then used to form field isolation 24.

Figure 4:
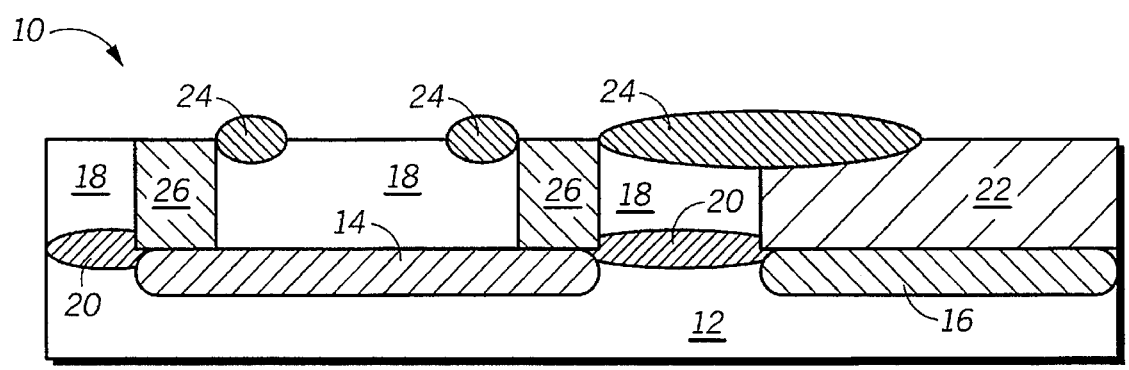

Following the formation of field isolation 24 the process continues with the formation of an n-type conductivity collector contact region 26. Collector contact region 26 extends through doped region 18 and is electrically coupled to first buried layer 14, as shown in FIG. 4. In the preferred embodiment collector contact region 26 overlies the entire perimeter of first buried layer 14. Collector contact region 26 is formed using conventional doping techniques and is preferably doped with phosphorous.

Figure 5:
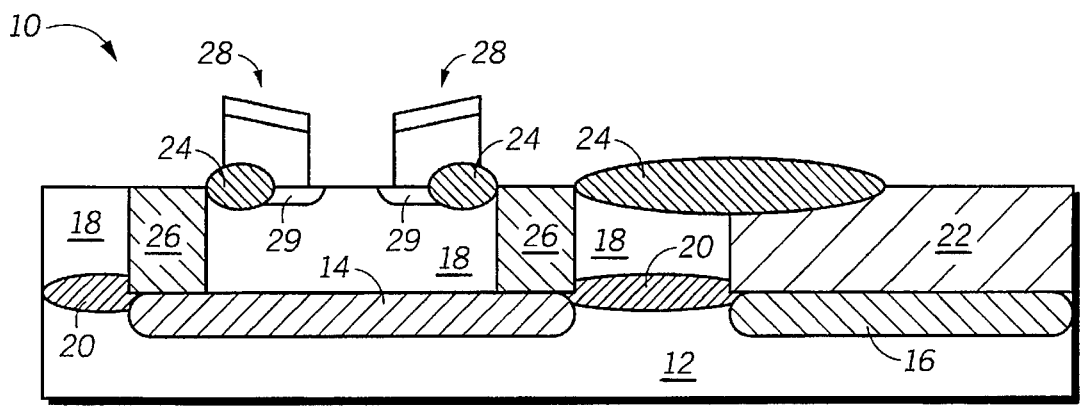

An extrinsic base region 28 is then formed overlying a portion of silicon substrate 12, as shown in FIG. 5. Extrinsic base region 28 is formed using conventional bipolar processing techniques and is preferably a laminate of p-type polysilicon and silicon dioxide. In the preferred embodiment, dopant from the p-type polysilicon is diffused into a portion of the underlying doped region 18 in order to form an extrinsic base link 29.

Figure 6:
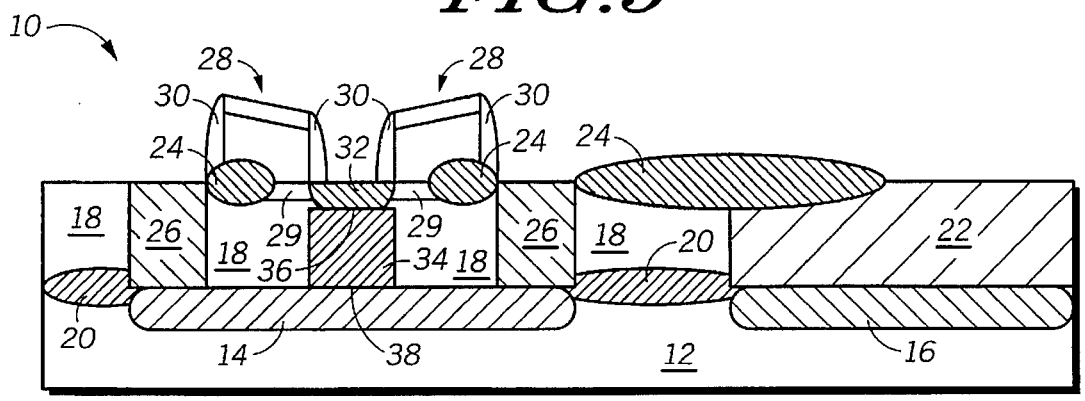

The process continues with the formation of a dielectric sidewall spacer 30 adjacent to the sidewall of extrinsic base region 28. Dielectric sidewall spacer 30 is formed using conventional sidewall spacer formation techniques. Using conventional doping techniques, intrinsic base region 32 and collector region 34 are then formed within a portion of doped region 18. Alternatively, intrinsic base region 32 and collector region 34 may also be formed prior to the formation of sidewall spacer 30. Intrinsic base region 32 has p-type conductivity and is preferably doped with boron. Collector region 34 has n-type conductivity and is preferably doped with phosphorous. The top surface 36 of collector region 34 abuts base region 32 and the bottom surface 38 of collector region 34 abuts first buried layer 14, as shown in FIG. 6.

Figure 7:
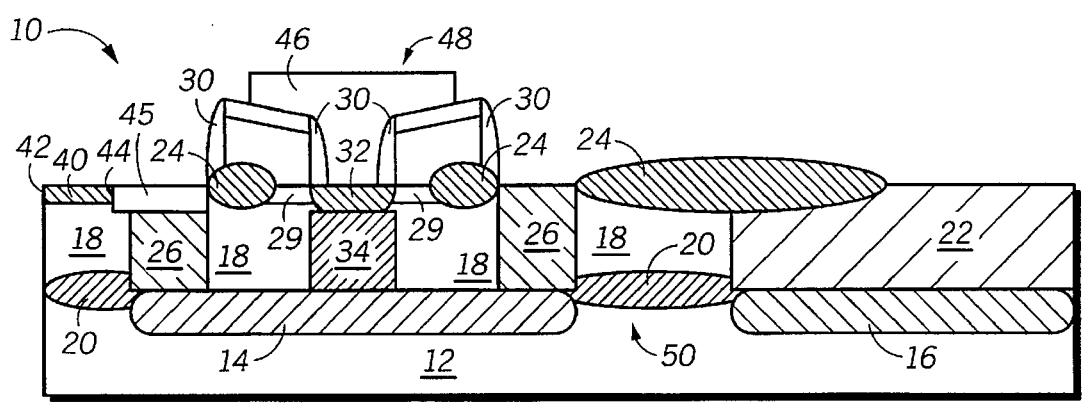

Using conventional doping techniques an optional resistor 40 is then formed within a portion of doped region 18. Resistor 40 overlies a portion of doped region 20 and has a first terminal 42 and a second terminal 44. Second terminal 44 is in intimate contact with a top portion 45 of collector contact region 26, as shown in FIG. 7. The doping concentration of top portion 45 is increased using conventional ion implantation techniques in order to insure that second terminal 44 is in intimate contact with top portion 45 of collector contact region 26. Top portion 45 is preferably implanted prior to the formation of resistor 40 and may extend beyond collector contact region 26. Resistor 40 has n-type conductivity and is preferably doped with arsenic. Alternatively, resistor 40 may be formed in an n-type polysilicon layer overlying a portion of doped region 18. Naturally, for a pnp bipolar transistor the resistor would have p-type conductivity. An emitter region 46 is then formed using conventional bipolar processing techniques. Emitter region 46 has n-type conductivity and is preferably polysilicon. As shown in FIG. 7, the resulting npn bipolar transistor 48 is laterally offset from well region 22 and second buried layer 16. In addition, three vertically stacked regions 50 of alternating conductivity type lie between bipolar transistor 48 and well region 22 and second buried layer 16. Vertically stacked regions 50 are used to reduce the parasitic capacitance of bipolar transistor 48. In the preferred embodiment vertically stacked regions 50 surround bipolar transistor 48.

Figure 8:
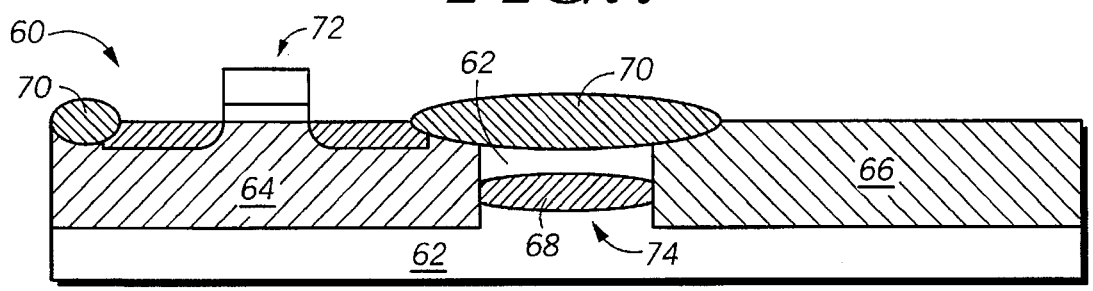
FIG. 8 illustrates, in cross-section, a second embodiment of the invention.

Analogously, vertically stacked regions of alternating conductivity type can also be used to reduce the parasitic capacitance of other semiconductor devices. Shown in FIG. 8 is a portion 60 of an integrated circuit structure comprising a silicon substrate 62 analogous to silicon substrate 12 in FIG. 7, a first well region 64 analogous to first buried layer 14 in FIG. 7, a second well region 66 analogous to second buried layer 16 in FIG. 7, a doped region 68 analogous to doped region 20 in FIG. 7, field isolation 70 analogous to field isolation 24 in FIG. 7, a field effect transistor 72 analogous to bipolar transistor 48 in FIG. 7, and vertically stacked regions 74 analogous to vertically stacked regions 50 in FIG. 7. First well region 64 and second well region 66 are formed using conventional doping techniques similar to those used to form first buried layer 14 and second buried layer 16 in FIG. 7. Doped region 68, however, is preferably formed by conventional ion implantation whereas doped region 20, is preferably formed by the auto-doping mechanism discussed earlier. The ion implantation energy is chosen such that doped region 68 is placed at an appropriate depth below the surface of substrate 62 resulting in the formation of three vertically stacked regions 74 of alternating conductivity type. In contrast to vertically stacked regions 50 in FIG. 7, the conductivity region overlying doped region 68 is not a portion of an epitaxial layer but is a portion of substrate 62, and thus has the same conductivity as substrate 62. Additionally, the implantation dose is chosen such that the doping concentration of doped region 68 is much lower than the doping concentrations of either first well region 64 or second well region 66. Therefore, doped region 68 may be formed either before or after the formation of the well regions without the use of an additional masking step because the doping concentration of doped region 68 will not deleteriously effect the doping profiles of either of the well regions. Additionally, the implantation process results in doped region 68 being self-aligned to both of the well regions. After first well region 64, second well region 66, and doped region 68 are formed, a conventional isolation process such as LOCOS is then used to form field isolation 70. Conventional processing techniques are then used to form field effect transistor 72.

The foregoing description and illustrations contained herein demonstrate many of the advantages associated with the present invention. Formation of the bipolar device in a p-well allows one end of the n-type resistor to be directly merged or contacted to the collector contact. Therefore, the area occupied by the resistor and the bipolar transistor is minimized. Additionally, since the resistor is directly contacting the collector contact the parasitic capacitance associated with this node is reduced because additional metal layers are not required to connect the resistor to the bipolar transistor. Moreover, the parasitic capacitance of the bipolar device is minimized by placing vertically stacked regions, of alternating conductivity type, between the bipolar transistor and the offset p-type conductivity region or regions that border the bipolar transistor. As shown in FIG. 7, doped region 20 contacts first buried layer 14, of bipolar transistor 48, and second buried layer 16 and well region 22. Under reverse bias, doped region 20 is fully depleted because of its light doping concentration and the parasitic capacitance between bipolar transistor 48 and well region 22, and second buried layer 16 is minimized. Naturally, the reduction in parasitic capacitance is greatest when the dopant concentrations of the stacked regions are optimized for the intended operating bias. Additionally, these advantages are obtained without adding additional masking steps to the fabrication process. Furthermore, since collector region 34 abuts first buried layer 14 and intrinsic base region 32, the collector resistance of the bipolar transistor is minimized and thus the performance of the bipolar transistor is enhanced. Moreover, the technique of using vertically stacked regions of alternating conductivity type to reduce parasitic capacitance can also be applied to other semiconductor devices such as field effect transistors.

Thus it is apparent that there has been provided, in accordance with the invention, a semiconductor device that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, three vertically stacked regions of alternating conductivity type were used to reduce the parasitic capacitance of semiconductor devices, but more than three vertically stacked regions of alternating conductivity type could also have been used to reduce the parasitic capacitance of semiconductor devices. Additionally, although a npn bipolar transistor was described in FIGS. 1–7, a pnp bipolar transistor could also be fabricated in a similar manner by making the appropriate changes in conductivity type. Similarly, although a p-type field effect transistor was fabricated in FIG. 8, an n-type field effect transistor could also have been fabricated by making the appropriate changes in conductivity type. Furthermore, although field effect transistor 72 is shown to be formed within well region 64, it could also have been formed within well region 66. Additionally, a semiconductor device could also have been fabricated within well region 66 in addition to field effect transistor 72 in well region 64. Furthermore, it is envisioned that the parasitic capacitance of other semiconductor devices such as diodes, resistors, capacitors, vertical transistor structures, et cetera could also be reduced using processes similar to those described for the bipolar transistor or the field effect transistor. Furthermore, the invention is not limited to single crystal silicon substrates. Other substrates could such gallium arsenide, indium phosphide, silicon on insulator, germanium, et cetera, could be used. Therefore, it is intended that this invention encompass all such variations and modifications as fall within the scope of the appended claims.

We claim:

1. A method for forming a semiconductor device comprising the steps of:

providing a substrate of a first conductivity type;

forming a first buried layer of a second conductivity type within a portion of the substrate;

forming a doped epitaxial silicon region of the first conductivity type overlying the first buried layer;

forming a base region lying within a first portion of the doped epitaxial silicon region;

forming a collector region of the second conductivity type lying within a second portion of the doped epitaxial silicon region, the collector region having a top surface and a bottom surface wherein the top surface abuts the base region and the bottom surface abuts the first buried layer;

forming an emitter region overlying the base region;

forming a collector contact region of the second conductivity type extending through a third portion of the doped epitaxial silicon region and abutting the first buried layer; and forming a resistor of the second conductivity type within a fourth portion of the doped epitaxial silicon region and abutting a portion of the collector contact region.

2. The method of claim 1, wherein the step of forming the collector region comprises implanting n-type dopants into the doped epitaxial silicon region.

3. The method of claim 1, wherein the base region is formed prior to forming the collector region.

4. The method of claim 1, wherein the step of forming the resistor comprises implanting n-type dopants into the doped epitaxial silicon region.

5. The method of claim 1, further comprising the step of forming an extrinsic base region overlying a portion of the doped epitaxial silicon region.

6. The method of claim 5, wherein the step of forming the extrinsic base region comprises forming a layer of polysilicon.

7. A method for forming a semiconductor device comprising the steps of:

providing a substrate having p-type conductivity;

forming a first buried layer having n-type conductivity within a portion of the substrate;

forming an epitaxial silicon layer having p-type conductivity overlying the first buried layer;

forming a base region having p-type conductivity within a first portion of the epitaxial silicon layer;

forming a collector region having n-type conductivity within a second portion of the epitaxial silicon layer, the collector region having a top surface and a bottom surface wherein the top surface abuts the base region and the bottom surface abuts the first buried layer;

forming an emitter region having n-type conductivity abutting a portion of the base region;

forming a collector contact region having n-type conductivity extending through a third portion of the epitaxial silicon layer, wherein the collector contact region abuts the first buried layer; and forming a resistor having n-type conductivity, wherein the resistor lies within a fourth portion of the epitaxial silicon layer and abuts a portion of the collector contact region.

8. The method of claim 7, wherein the step of forming the collector region comprises implanting n-type dopants into the epitaxial silicon layer.

9. The method of claim 7, wherein the base region is formed prior to forming the collector region.

10. The method of claim 7, wherein the step of forming the resistor comprises implanting n-type dopants into the epitaxial silicon layer.

11. The method of claim 7, further comprising the step of forming an extrinsic base region overlying a portion of the epitaxial silicon layer.

12. The method of claim 11, wherein the step of forming the extrinsic base region comprises forming a layer of polysilicon.

13. The method of claim 7, wherein the step of forming the emitter region comprises forming a layer of polysilicon.

14. A method for forming a semiconductor device comprising the steps of:

providing a substrate having a first conductivity type;

forming a first buried layer within a portion of the substrate, the first buried layer having a second conductivity type;

forming an epitaxial silicon layer overlying the first buried layer, the epitaxial silicon layer having the first conductivity type;

forming a collector contact region for a bipolar transistor, wherein the collector contact region extends through a first portion of the epitaxial silicon layer and abuts the first buried layer, the collector contact region having the second conductivity type; and forming a resistor within a second portion of the epitaxial silicon layer, wherein the resistor abuts a portion of the collector contact region, the resistor having the second conductivity type.

15. The method of claim 14, wherein the step of forming the first buried layer is further characterized as forming the first buried layer with a n-type conductivity.

16. The method of claim 14, further comprising the step of forming a base region having the first conductivity type within a third portion of the epitaxial silicon layer.

17. The method of claim 16, further comprising the step of forming an emitter region abutting a portion of the base region.

18. The method of claim 17, wherein the step of forming the emitter region comprises forming a layer of polysilicon.

19. The method of claim 1, further comprising the step of forming a second buried of the first conductivity type laterally offset from the first buried layer.

20. The method of claim 19, further comprising the step of forming a doped region of the second conductivity type lying between the first buried layer and the second buried layer, wherein the doped region abuts the first buried layer and the second buried layer.

21. The method of claim 20, wherein the step of forming the resistor is further characterized as forming the resistor to overlie the doped region.

22. The method of claim 7, further comprising the step of forming a second buried having p-type conductivity laterally offset from the first buried layer.

23. The method of claim 22, further comprising the step of forming a doped region having n-type conductivity lying between the first buried layer and the second buried layer, wherein the doped region abuts the first buried layer and the second buried layer.

24. The method of claim 23, wherein the step of forming the resistor is further characterized as forming the resistor to overlie the doped region.

25. The method of claim 14, further comprising the step of forming a second buried of the first conductivity type laterally offset from the first buried layer.

26. The method of claim 25, further comprising the step of forming a doped region of the second conductivity type lying between the first buried layer and the second buried layer, wherein the doped region abuts the first buried layer and the second buried layer.

27. The method of claim 26, wherein the step of forming the resistor is further characterized as forming the resistor to overlie the doped region.

* * * * *

UNITED STATES PATENT AND TRADEMARK OFFICE
CERTIFICATE OF CORRECTION

PATENT NO: 5,624,854

DATED: April 29, 1997

INVENTORS: Robert C. Taft; James D. Hayden

It is certified that error appears in the above-identified patent and that said Letters Patent are hereby corrected as shown below:

Column 6, line 66, change "a second buried of" to --a second buried layer of--

Column 7, line 11, change "a second buried    " to --a second buried layer of--

Column 8, line 5, change "a second buried of" to --a second buried layer of--

Signed and Sealed this

Seventh Day of April, 1998

*Attest:*

BRUCE LEHMAN

*Attesting Officer*   *Commissioner of Patents and Trademarks*